(12) United States Patent
Holmes

(10) Patent No.: US 10,490,378 B1
(45) Date of Patent: *Nov. 26, 2019

(54) FINE-SCALE MICRO-AIR BRIDGE FUSE

(71) Applicant: Facebook Technologies, LLC, Menlo Park, CA (US)

(72) Inventor: Stephen John Holmes, Glasgow (GB)

(73) Assignee: Facebook Technologies, LLC, Menlo Park, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/673,272

(22) Filed: Aug. 9, 2017

(51) Int. Cl.
| | | |
|---|---|---|
| H01L 23/525 | (2006.01) | |
| H01H 85/041 | (2006.01) | |
| H01H 85/46 | (2006.01) | |
| H01H 85/02 | (2006.01) | |
| H01H 85/046 | (2006.01) | |
| H05K 3/46 | (2006.01) | |
| H01H 69/02 | (2006.01) | |

(52) U.S. Cl.
CPC ...... *H01H 85/0411* (2013.01); *H01H 69/022* (2013.01); *H01H 85/0241* (2013.01); *H01H 85/046* (2013.01); *H01H 85/463* (2013.01); *H01L 23/5258* (2013.01); *H05K 3/4697* (2013.01); *H05K 2201/10181* (2013.01)

(58) Field of Classification Search
CPC ..... H01L 23/00; H01L 23/5258; H01L 23/52; H01L 23/4821; H01L 23/3171; H01L 23/495; H01L 23/50; H01L 23/5252; H01L 23/5254; H01L 23/5256; H01L 23/60; H01L 33/62; H01L 27/00; H01L 27/156; H01L 27/11206
USPC ........................................................ 257/529
See application file for complete search history.

(56) References Cited

U.S. PATENT DOCUMENTS

| | | | |
|---|---|---|---|
| 6,246,118 B1 * | 6/2001 | Buynoski | ............ H01L 23/4821 257/758 |
| 2008/0122114 A1 | 5/2008 | Lu et al. | |
| 2017/0229395 A1 * | 8/2017 | Kim | ..................... H01L 23/5256 |

* cited by examiner

*Primary Examiner* — Chuong A Luu
(74) *Attorney, Agent, or Firm* — Fenwick & West LLP

(57) ABSTRACT

Structures of and methods for fabricating fine-scale interconnects and fuses are disclosed. A "mushroom"-type structure with a narrow stalk supporting a wider cap can be used for fine-scale interconnects with widths on the scale of hundreds of nanometers that have low resistivity. Micro-air bridges can be introduced by omitting the stalk in sections of the interconnect, allowing the interconnect to bridge over obstacles. The mushroom-type micro-air bridge structure can also be modified to create fine-scale fuses that have low resistivity overall and sections of significantly higher resistivity where the micro-air bridges exist. The significantly higher resistivity results in preferential fusing at the micro-air bridges. Both mushroom interconnects and mushroom fuses can be fabricated using electron beam lithography.

11 Claims, 6 Drawing Sheets

FINE-SCALE MICRO-AIR BRIDGE FUSE

TECHNICAL FIELD

The present disclosure relates to traces and components in circuits, and more specifically to fine-scale interconnects and fuses.

BACKGROUND

As solid state electronic display technology moves to smaller scales, formation of interconnects that can address multiple circuit elements independently becomes increasingly challenging. This difficulty is magnified when all interconnects need to be on the same face of the substrate and the morphology needs to be maintained as approximately planar. Conventional approaches for creating interconnects, such as photolithographic techniques have lower bounds on the feature sizes they can produce due to the wavelength of light that is used to expose the resist. Special techniques, such as e-beam lithography and Damascene processes, can be used to create even smaller feature sizes, but they are not universally applicable.

High-density interconnects are generally formed by bridging one conductor over another using a dielectric material to separate the two conductors. However, even bridging interconnects over one another like this is limited by pin-hole density, unacceptably increased parasitic capacitance, and difficulties associated with optically defining fine metal tracks over stepped material. Interconnects with air bridges can be fabricated using sacrificial layers that support interconnects prior to plating and are later removed, but this requires multiple processing steps and results in radically non-planar surfaces.

SUMMARY

A "mushroom"-type structure (a narrow stalk supporting a wider cap) can be used to produce fine-scale low-resistivity interconnects with widths on the scale of hundreds of nanometers. Micro-air bridges can be introduced by omitting the stalk in sections of the interconnect, allowing the interconnect to bridge over obstacles. The mushroom-type micro-air bridge structure can also be modified to create fine-scale fuses that have low resistivity overall and sections of significantly higher resistivity where the micro-air bridges exist. The significantly higher resistivity results in preferential fusing at the micro-air bridges.

BRIEF DESCRIPTION OF THE DRAWINGS

Exemplary implementations of the present disclosure are described herein with reference to the accompanying drawings, in which.

Figure (FIG. 1A is diagram of a first cross-sectional view of a mushroom interconnect, according to one embodiment.

DETAILED DESCRIPTION

Embodiments relate to fine-scale fuses in electronic circuits. A fine-scale fuse between a first point and a second point on a substrate may include a first section extending from the first point, a second section extending from the first section, and a third section extending from the second section to the second point. Each of the first and second segments has a stalk segment and a cap segment on top of the stalk segment. A cap segment of the second section is suspended between the first segment and the second segment without a supporting stalk segment so that a layer of air exists between the substrate and the cap segment of the second section. The second section has higher resistivity than the first and third sections, resulting in preferential melting of the second section during periods of overcurrent.

Embodiments also relate to fabricating a fine-scale fuse by using electron beams. A first electron beam that can penetrate all resist layers on a substrate is directed along a path on the substrate but shielded for at least a portion of the path. A second electron beam that cannot penetrate all the way through all of the resist layers on the substrate is directed along the entire path without being shielded. Exposed portions of the resist are removed and then filled with an interconnect material. The rest of the resist is removed, resulting in a fuse structure with a suspended portion that corresponds to where the first electron beam was shielded.

Reference will now be made in detail to several embodiments, examples of which are illustrated in the accompanying figures. It is noted that wherever practicable similar or like reference numbers may be used in the figures and may indicate similar or like functionality. The figures depict embodiments of the disclosed system (or method) for purposes of illustration only. One skilled in the art will readily recognize from the following description that alternative embodiments of the structures and methods illustrated herein may be employed without departing from the principles described herein.

Example Mushroom Interconnects with Micro-Air Bridges

Figure 1A:
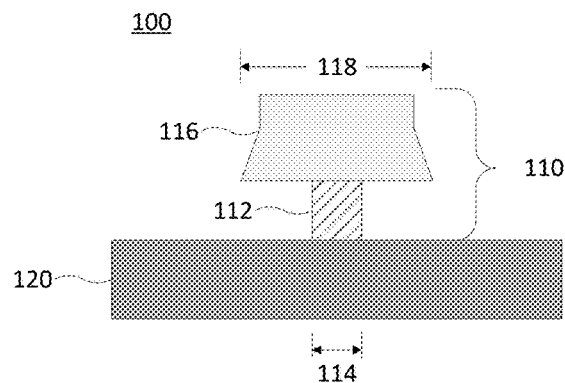
FIG. 1B is a diagram illustrating a second cross-sectional view of a mushroom interconnect crossing over an obstacle, according to one embodiment.

FIG. 1A is diagram of a first cross-sectional view 100 of a "mushroom interconnect" 110 on a substrate 120, according to one embodiment. The mushroom interconnect 110 has the cross-section of a mushroom gate and is used as an IC interconnect to connect electrical elements (i.e., electrical contacts). For the purposes of explanation, the mushroom interconnect 110 has two structural components: a stalk 112 with a width 114 and a cap 116 with a width 118. Though the stalk 112 and the cap 116 are discussed herein as separate parts, they may be continuous and created of the same material in the same deposition step, as explained in conjunction with FIG. 2.

Figure 1B:
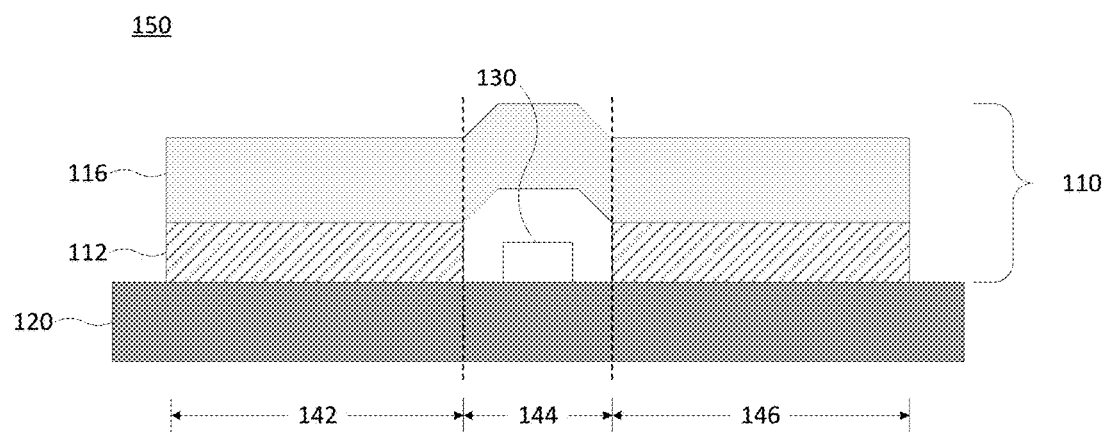

In a typical mushroom gate (which similarly has a stalk 112 and a cap 116), the stalk 112 is connected to the active region and its width 114 is significantly narrower than the width 118 of the cap 116, which sits on top of the stalk 112 and has a mushroom-like shape (wider on the bottom than the top, potentially with a centrally-located trough along the length of the top of the cap 116). This structure results in a short effective gate length and low gate resistance. The disclosed mushroom interconnect 110 utilizes these structural components to reduce the footprint of the interconnect 110 on the substrate 120 and further modifies it to include one or more air-bridges, as shown in FIG. 1B. In some embodiments, the width 114 of the stalk 112 may be 200-300, or specifically 200 or 250 nanometers. In one embodiment, the width 118 of the cap 116 is 500-800 nanometers, or specifically 500 or 750 nanometers.

Only the stalk 112 of the mushroom interconnect 110 comes into contact with the substrate 120. Accordingly, any section of the mushroom interconnect 110 that does not have a stalk 112 instead has a micro-air bridge and does not come into contact with the substrate 120 in that area.

FIG. 1B is a diagram of a second cross-sectional view 150 of a mushroom interconnect 110 crossing over an obstacle 130, according to one embodiment. The second cross-sectional view 150 of the mushroom interconnect 110 is along the length of the interconnect 110 (i.e., between two or more points being connected by the interconnect 110) and is perpendicular to the first cross-sectional view 100 of the mushroom interconnect 110, which is across the width of the interconnect 110. The obstacle 130 is an object or area with which the mushroom interconnect 110 does not come into contact. The obstacle 130 may be, for example, an electrical contact to an independently-controlled device.

The mushroom interconnect 110 has at least a first section 142, a second section 144, and a third section 146. In the first section 142 and the third section 146, the mushroom interconnect 110 has both a stalk 112 and a cap 116. In the second section 144, the mushroom interconnect 110 does not have a stalk 112. Instead, the second section 144 of the mushroom interconnect 110 only has a cap 116, which passes over the obstacle 130 without coming into contact with it. The gap between the obstacle 130 and the cap 116 is filled with air, resulting in an "air bridge" in the mushroom interconnect 110 where the obstacle 130 is located.

In some embodiments, the cap 116 in the second section 144 of the mushroom interconnect 110 is raised relative to the cap 116 in other sections 142 and 146 of the mushroom interconnect 110 (as shown in FIG. 1B). However, that need not always be the case—in some embodiments, the cap 116 is at the same height in all three section of the mushroom interconnect 110. One of many factors that may affect the height of the cap 116 is the height of the obstacle 130 and the air gap for adequately insulating the obstacle 130 from the mushroom interconnect 110. If the sum of the height of the air gap for insulating the obstacle and the height of the obstacle 130 is less than/equal to the height of the stalk 112, the cap 116 may not be raised to function effectively. In that case, the cap 116 may be raised due to specific steps in the fabrication process, which is discussed in further detail in conjunction with FIG. 2. For example, the resist layer corresponding to the stalk 112 may be deposited in an even layer that conforms to the topology of the substrate 120, including the obstacle 130. In that situation, the air gap is approximately the height of the stalk 112 and the cap 116 is raised (relative to the cap 116 in the other sections of the interconnect 110) by that same height of the stalk 112. In some embodiments, the mushroom interconnect 110 may need to pass over several obstacles 130, resulting in multiple air bridges in a single interconnect 110.

Example Method for Fabricating Mushroom Interconnects

Figure 2:
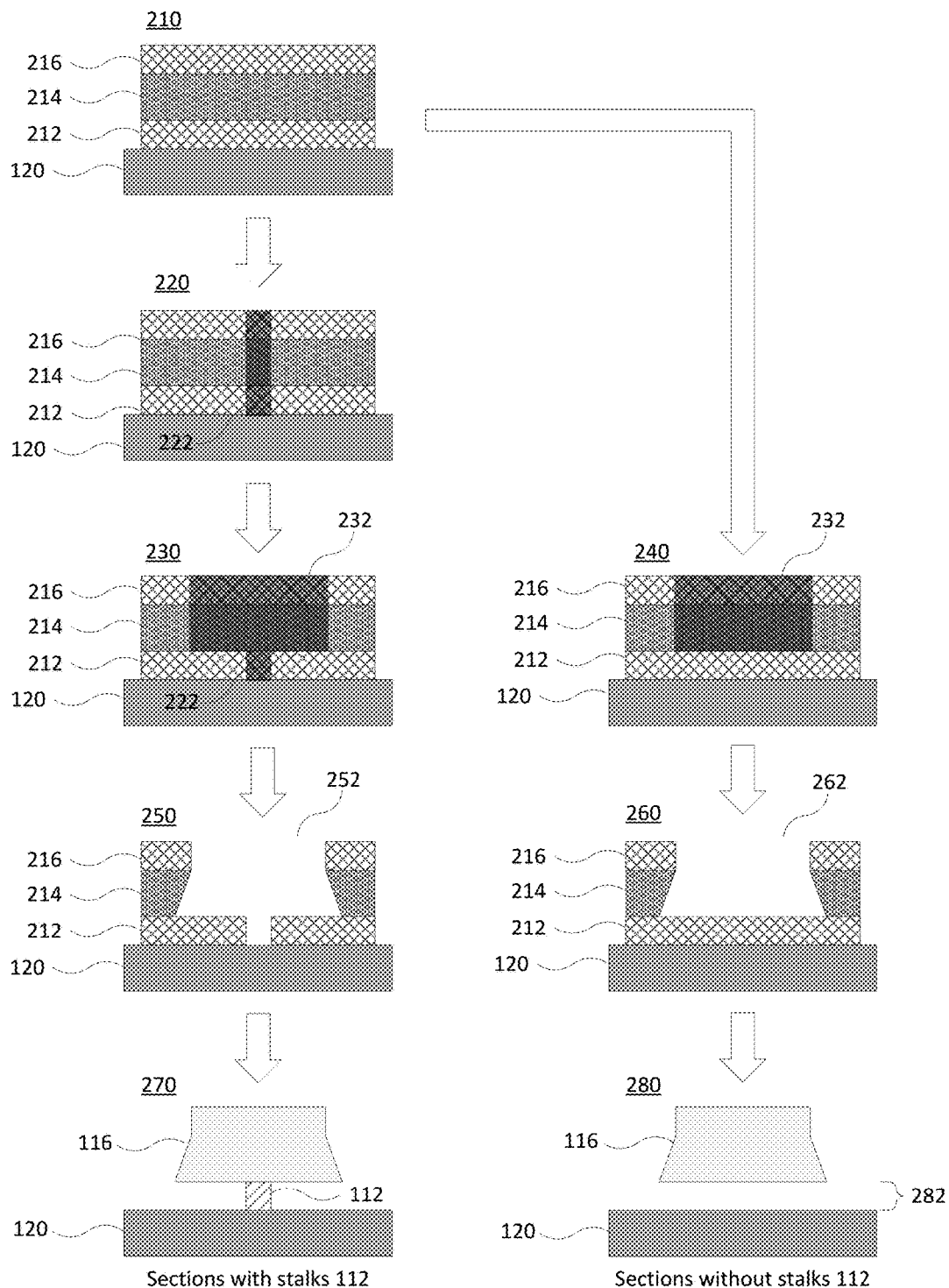
FIG. 2 is a series of cross-sectional diagrams illustrating steps of a method for fabricating a mushroom interconnect on a substrate, according to one embodiment.

FIG. 2 is a series of cross-sectional diagrams illustrating steps of a method 200 for fabricating a mushroom interconnect 110 on a substrate 120, according to one embodiment. This method includes lithographic processes (shown as 210, 220, 230, 240, 250, and 260), and deposition processes (as shown as 270 and 280). Tri-layer e-beam resist may be used in the lithography steps to create high-resolution features on the scale of hundreds of nanometers. For sections of the substrate 120 where the mushroom interconnect 110 will have a stalk 112 (e.g., section 142 and 146 of FIG. 1B), the method comprises processes associated with 210, 220, 230, 250, and 270 in FIG. 2. For sections of the substrate 120 where the mushroom interconnect 110 will not have a stalk 112 (e.g., section 144 in FIG. 1B), the method comprises processes associated with 210, 240, 260, and 280 in FIG. 2.

The substrate 120 is prepared 210 for e-beam lithography by deposition of e-beam resist on the substrate 120. Each of the e-beam resist layers 212, 214, and 216 is applied to the substrate 120 using conventional deposition methods, such as spin-coating or dip-coating. In some embodiments, the e-beam resist layers 212, 214, and 216 conform to the surface of the substrate 120, which can result in raised sections of the mushroom interconnect 110 where contacts or obstacles exist. Though three e-beam resist layers 212, 214 and 216 are shown in FIG. 2, fewer (e.g., one) or more layers of e-beam resist may be used instead. An example tri-layer e-beam resist stack comprises two layers of polymethyl methacrylate (PMMA) resist separated by a layer of copolymer resist. In another embodiment, a bilayer e-beam resist stack is used and may comprise a bottom layer of a PMMA resist and a top layer of copolymer resist, such as a PMMA/methacrylic acid (MA) resist.

The one or more e-beam resist layers 212, 214, and 216 are exposed 220, 230, and 240 to beams of electrons that weaken the layers of e-beam resist 212, 214, and 216. For sections of the substrate 120 where the mushroom interconnect 110 will have stalk 112, the substrate 120 is exposed 220 to a first electron beam. This first electron beam is high energy and powerful enough to penetrate through and expose all of the e-beam resist layers 212, 214, and 216. The first electron beam exposes a narrow portion 222 of the e-beam resist layers 212, 214, and 216, the exact dimensions of which may vary based on the desired dimensions of the stalk 112 of the mushroom interconnect 110 and limitations of e-beam technology. The width of the exposed portion 222 may be substantially similar to the desired stalk 112 width, examples of which are given in conjunction with FIG. 1A.

After being exposed 220 to the first electron beam, the substrate 120 is exposed 230 to a second electron beam that is not as powerful as the first electron beam to create the cap 116 of the mushroom interconnect 110. The second electron beam is lower energy than the first electron beam and does not penetrate through and expose the full depth of the one or more e-beam resist layers 212, 214, and 216. For example, the second electron beam may only expose the top two layers 214 and 216 in a tri-layer resist stack, or the top layer in a bi-layer resist stack. The second electron beam has a wider, more diffuse footprint than the first electron beam, resulting in an exposed portion 232 of the one or more e-beam resist layers 212, 214, and 216 that is both wider and shallower than the exposed portion 222. In some embodiments, the second electron beam is passed over the substrate 120 multiple times in order to fully expose portion 232. Specifically, the second electron beam may perform a first pass over the substrate 120 where it is offset from (i.e., not centered over) from the exposed portion 222 and a second pass over the substrate 120 where it is offset in the opposite direction of the first pass. This is further discussed in conjunction with FIG. 3.

For sections of the mushroom interconnect 110 that will not have a stalk 112, the substrate 120 is not exposed 220 to the first electron beam, and is instead only exposed 240 to the second electron beam. Since there is no exposed section 222 with which the second electron beam can be aligned for exposure 240, the second electron beam may instead be offset from an axis along the length of the substrate 120 that lines up with the exposed sections 222 in the sections of the substrate 120 that will have a stalk 112. Though a "first" and a "second" electron beam are discussed above, in practice, these may be the same electron beam that is focused differently such that it has different power and footprint characteristics.

The exposed portions 222 and 232 of the e-beam resist are developed and removed 250 and 260. Removal 250 of exposed portions 222 and 232 results in a gap 252 in the e-beam resist corresponding to both a stalk 112 and a cap 116. Removal 260 of the exposed portion 232 results in a gap 262 in the e-beam resist that only corresponds to a cap 116.

Finally, an interconnect material is deposited 270 and 280 into gaps 252 and, and the remaining portions of the e-beam resist 212, 214, and 216 are removed. Possible interconnect materials include conductive materials such as, but not limited to, platinum, gold, silver, copper, titanium, and layer combinations of these materials.

The remaining portions of e-beam resist layers 212, 214, and 216 are removed using conventional stripping techniques. The resulting structures include a section of the mushroom interconnect 110 with both a stalk 112 and a cap 116 that in direct contact with the substrate 120 (as shown in 270), and a second section of the mushroom interconnect 110 with only a cap 116 that does not come into contact with the substrate 120 and is instead separated from the substrate 120 by a layer of air 282 (as shown in 280).

Figure 3:
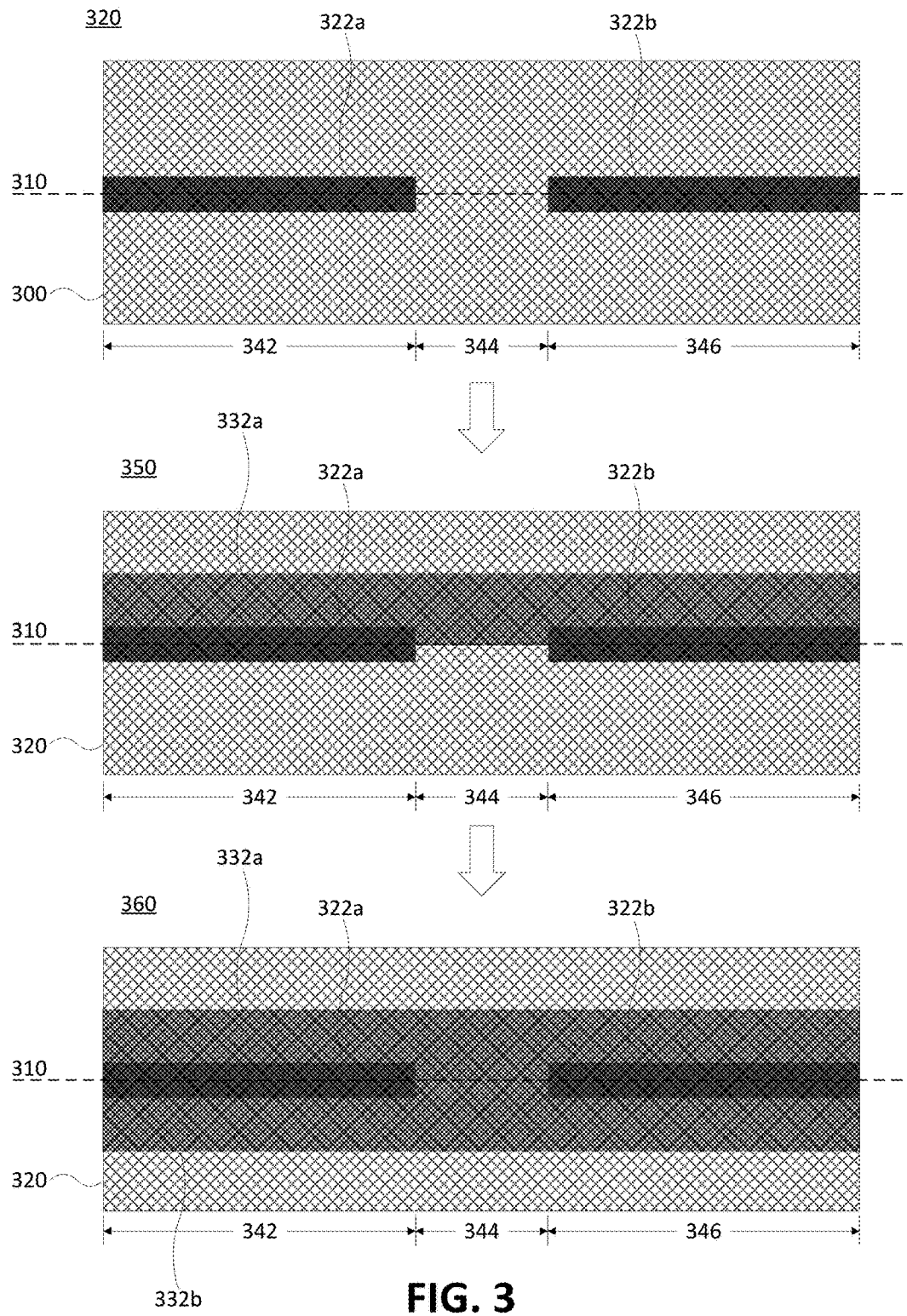
FIG. 3 is a series of top-down view diagrams illustrating steps for exposing the substrate to multiple electron beams in a top-down view, according to one embodiment.

FIG. 3 is a series of top-down view diagrams illustrating steps for exposing the substrate 320 to multiple electron beams in a top-down view, according to one embodiment. Views 300, 350, and 360 of FIG. 3 illustrate the exposure 220, 230, and 240 from method 200 in the context of the fabrication of an entire mushroom interconnect 110, instead of relative to cross-sections of the mushroom interconnect 110.

For the purposes of explanation, substrate 120 with one or more e-beam resist layers 212, 214, and 216 is collectively referred to as the substrate 320 in this figure, even though only the e-beam resist layer 216 would be visible from the top-down view. Substrate 320 has an axis 310 running along the length of what will be the mushroom interconnect 110. Substrate 320 has three sections 342, 344, and 346 that correspond to three sections (e.g., 142, 144, and 146 of FIG. 1B, respectively) of the resultant mushroom interconnect 110. The mushroom interconnect 110 will have a stalk 112 in the first and third sections 342 and 346, respectively, of the substrate 320. The mushroom interconnect 110 will not have a stalk 112 in the second section 344 of the substrate 320. Accordingly, steps 220 and 230 of method 200 are performed on the first and third sections 342 and 346 of the substrate 320 while step 240 of method 200 is performed on the second section 344 of the substrate 320.

Portions of the substrate 320 that correspond to the stalk 112 are exposed 300 along the axis 310 using the first electron beam. The stalk 112 exists in the first and third sections 342 and 346, so portion 322a is exposed in the first section 342 and portion 322b is exposed in the third section 346 (both according to exposure 220 of method 200). For example, the first electron beam is directed towards the portions of the substrate 320 that correspond to the stalk 112.

No portion of section 344 is exposed by the first electron beam because no stalk 112 exists there. Instead, section 344 is "shielded" from the first electron beam, which in this context means that it is not exposed to the first electron beam. This may be achieved by simply turning off the first electron beam during that portion of the trace, rather than physically shielding section 344 from first electron beam itself. In embodiments where the mushroom interconnect 110 overlaps with an obstacle 130, section 344 of the substrate corresponds to the area around and including the obstacle 130. Examples are further discussed in FIGS. 4, 5, and 6.

Portions of the substrate 320 that correspond to the cap 116 of the mushroom interconnect 110 are exposed 350 and 360 along the axis 310 using the second electron beam. Because the cap 116 of the mushroom interconnect 110 is continuous and exists in all three sections 342, 344, and 346 of the substrate 320, all three sections 342, 344, and 346 of the substrate 320 are exposed 350 and 360. In view 350, a portion 332a extending through all three sections 342, 344, and 346 of the substrate 320 is exposed by the second electron beam in a first pass where the second electron beam is offset above the axis 310. In view 360, a portion 332b extending through all three sections 342, 344, and 346 of the substrate 320 is exposed by the second election beam in a second pass where the second electron beam is offset below than the axis 310. Exposure 350 and 360 of the first and third sections 342 and 346 of the substrate 320 correspond to exposure 230 of method 200. Exposure 350 and 360 of the second section 344 of the substrate correspond to exposure 240 of method 200.

In some embodiments, portions 332a and 332b overlap minimally, such that exposed portions 332a and 332b connect but also preferably have a consistent exposure depth. Exposure depth may be greater in overlap regions due to multiple exposures, resulting in a cap 116 that extends lower in those overlap regions. Exposure depth is primarily a consideration in section 344, where the deeper exposed portion 322 corresponding to the stalk 112 does not exist.

Example Mushroom Interconnects

Figure 4:
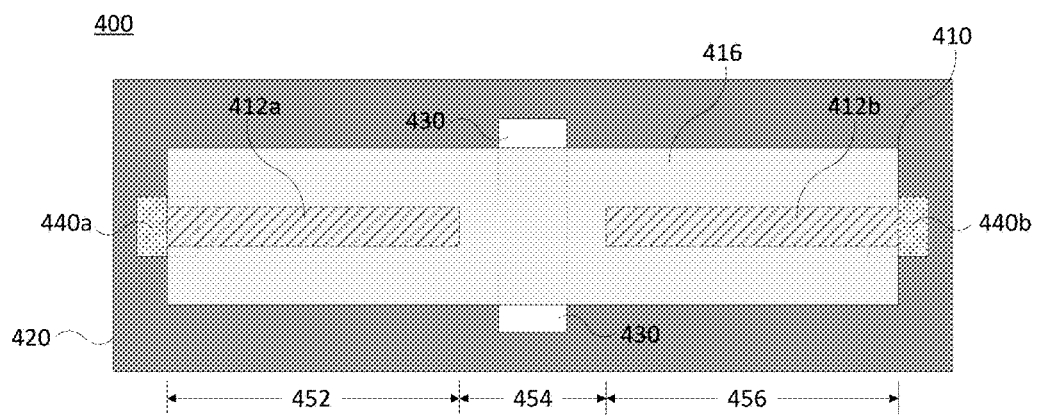
FIG. 4 illustrates a top-down view of a mushroom interconnect passing over an obstacle on a substrate, according to a first embodiment.

FIG. 4 illustrates a top-down view 400 of a mushroom interconnect 410 passing over an obstacle 430 on a substrate 420, according to a first embodiment. Mushroom interconnect 410 has a cap 416, and stalk segments 412a and 412b (collectively referred to as stalk 412). The stalk 412 is indicated in dashed lines because it is fully concealed by the cap 416. Two contacts 440a and 440b and an obstacle 430 are attached to substrate 420. Portions of the contacts 440a and 440b and the obstacle 430 that are concealed by the cap 416 and/or the stalk 412 are indicated in dotted lines.

The mushroom interconnect 410 has a first section 452, a second section 454, and a third section 456; and extends from the first contact 440a over the obstacle 430 to the second contact 440b. The cap 416 continuously spans and electrically connects all three sections 452, 454, and 456 of the mushroom interconnect 110.

The first section 452 of the mushroom interconnect 410 has a stalk segment 412a that is electrically connected to the first contact 440a and the cap 116. The third section 456 of the mushroom interconnect 110 has a stalk segment 412b that is electrically connected to the second contact 440b and the cap 116. The second section 454 of the mushroom interconnect 410 does not have a stalk segment and is not electrically connected to the obstacle 430. Instead, the second section 454 is a micro-air bridge that separates the cap 116 from the obstacle 430 with air. To avoid all contact with the obstacle 430, the micro-air bridge of the second section 454 spans an area larger than the obstacle 430 itself. Thus, even the sides of the obstacle 430 are separated from the inner sides of the stalk segments 412a and 412b by a layer of air.

Figure 5:
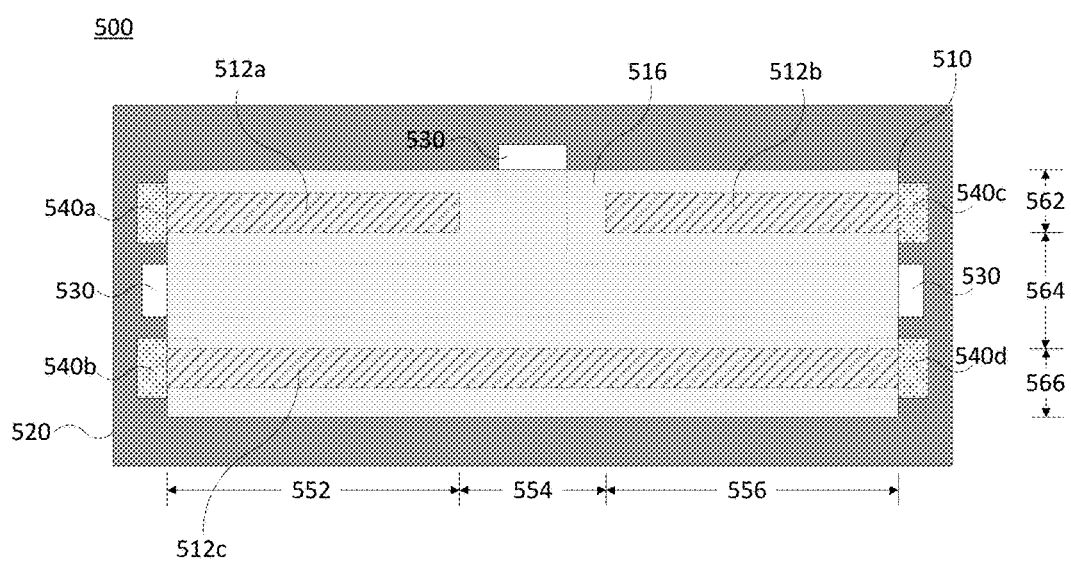
FIG. 5 illustrates a top-down view of a mushroom interconnect crossing over an obstacle on a substrate, according to a second embodiment.

FIG. 5 illustrates a top-down view 500 of a mushroom interconnect 510 crossing over an obstacle 530 on a substrate 530, according to a second embodiment. Mushroom interconnect 510 has a cap 516, and stalk segments 512a, 512b, and 512c (collectively referred to as stalk 512). The stalk 512 is indicated in dashed lines because it is fully concealed by the cap 516. Four contacts 540a, 540b, 540c, and 540d, and an obstacle 530 are attached to the substrate 520. Portions of the contacts 540a, 540b, 540c, and 540d and the obstacle 530 that are concealed by the cap 516 and/or the stalk 512 are indicated in dotted lines.

The mushroom interconnect 510 has a first vertical section 552, a second vertical section 554, a third vertical section 556, a first horizontal section 562, a second horizontal section 564, and a third horizontal section 566. The mushroom interconnect 510 connects contacts 540a, 540b, 540c, and 540d while passing over the obstacle 530, which has the shape of an upside-down "T." The cap 516 continuously spans and electrically connects all sections 552, 554, 556, 562, 564, and 566 of the mushroom interconnect 510.

The intersection of the first vertical section 552 and the first horizontal section 562 includes a stalk segment 512a that is electrically connected to the first contact 540a and the cap 516. The intersection of the third vertical section 556 and the first horizontal section 562 includes a stalk segment 512b that is electrically connected to the third contact 540c and the cap 516. The third horizontal section 566 includes a stalk segment 512c that is electrically connected to the second contact 540b, the fourth contact 540d, and the cap 516.

The intersection of the second vertical section 554 and the first horizontal section 562 does not have a stalk segment and is not electrically connected to the obstacle 530. Instead, this intersection is a first micro-air bridge (like section 454 of FIG. 4) that spans an area larger than the obstacle 530 itself and is separated from the obstacle 530 by air. The second horizontal section 564 similarly does not have a stalk segment and is not electrically connected to the obstacle 530. The second horizontal section 564 is a second micro-air bridge that bridges vertically from stalk segments 512a and 512b to stalk segment 512c, forming a structure that is similar to a tunnel, in that it has stalk segments 512a, 512b, and 512c enclosing it on both sides for most of its length.

As shown in FIG. 5, the stalk 512 does not need to form a single line (as is the case with mushroom interconnect 410 in FIG. 4). Instead, the stalk 512 can be made up of segments that are offset from the center of the interconnect 510 or run in different directions from each other as long as they are connected by a continuous cap 516. Additionally, the stalk 512 must mechanically support the cap 516 such that it doesn't collapse. Thus, the stalk 512 may include additional segments to support particularly wide caps 516 and/or to connect additional contacts 540 to the same interconnect 510.

Figure 6:
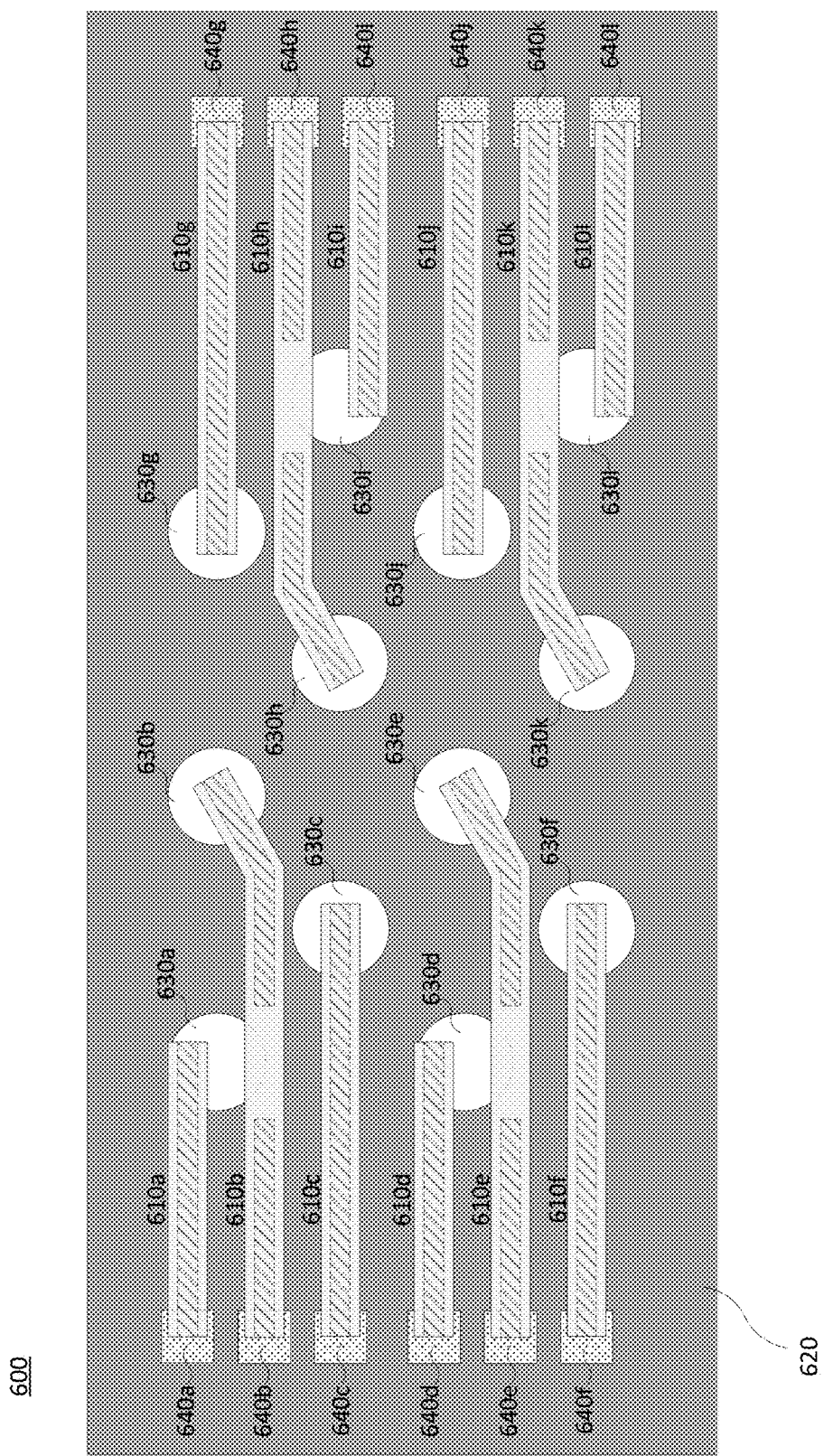
FIG. 6 illustrates a top-view of a densely-packed array of LED contacts connected to control contacts via mushroom interconnects, according to one embodiment.

FIG. 6 illustrates a top-view of a densely-packed array of LED contacts 630a-1 connected to control contacts 640a-1 via mushroom interconnects 610a-1, according to one embodiment. The LED contacts 630a-1 are formed on the surface of a substrate 620 and organized into four rows that are offset from each other. Due to the size and arrangement of the LED contacts 630a-1, as well as the width of the mushroom interconnects 610a-1, the LED contacts 630a-1 cannot be connected to their control contacts 640a-1 using conventional interconnects along simple paths. Instead, the conventional interconnects must be routed around any obstacles (i.e., other LED contacts 630a-1). Mushroom interconnects 610a-1, on the other hand, can bridge over the LED contacts 630a-1 that form obstacles. Though FIG. 6 is described with LED contacts, these are merely an example of one application for mushroom interconnects.

Each of the mushroom interconnects 610a-1 includes a cap, indicated in light grey, and a stalk, indicated by stripes enclosed by dashed lines (because the stalk is obscured by the cap). Mushroom interconnect 610a extends from control contact 640a and terminates at LED contact 630a. Mushroom interconnect 610b extends from control contact 640b, bridges over LED contact 630a, and terminates at LED contact 630b. Mushroom interconnect 610b does not have a stalk in the section where it bridges over LED contact 630a. Mushroom interconnect 610c extends from control contact 640c and terminates at LED contact 630c. Mushroom interconnect 610d extends from control contact 640d and terminates at LED contact 630d. Mushroom interconnect 610e extends from control contact 640e, bridges over LED contact 630d, and terminates at LED contact 630e. Similar to mushroom interconnect 610b, mushroom interconnect 610e does not have a stalk in the section where it bridges over LED contact 630d. Mushroom interconnect 610f extends from control contact 640f and terminates at LED contact 630f.

Mushroom interconnect 610g extends from control contact 640g and terminates at LED contact 630g. Mushroom interconnect 610h extends from control contact 640h, bridges over LED contact 630i, and terminates at LED contact 630h. Mushroom interconnect 610h does not have a stalk in the section where it bridges over LED contact 630i. Mushroom interconnect 610i extends from control contact 640i and terminates at LED contact 630i. Mushroom interconnect 610j extends from control contact 640j and terminates at LED contact 630j. Mushroom interconnect 610k extends from control contact 640k, bridges over LED contact 630l, and terminates at LED contact 630k. Similar to mushroom interconnect 610h, mushroom interconnect 610k does not have a stalk in the section where it bridges over LED contact 630l. Mushroom interconnect 610l extends from control contact 640l and terminates at LED contact 630l.

Mushroom Interconnects as Fuses

Figure 7A:
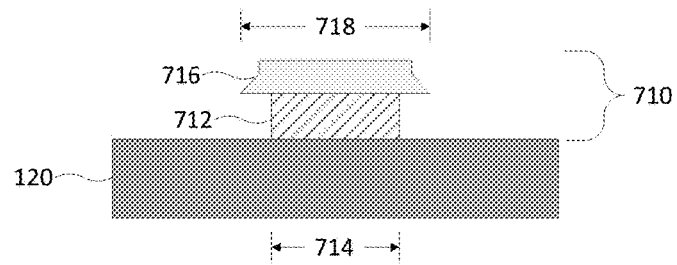
FIG. 7A is a diagram of a first cross-sectional view of a mushroom fuse, according to one embodiment.
Figure 7B:
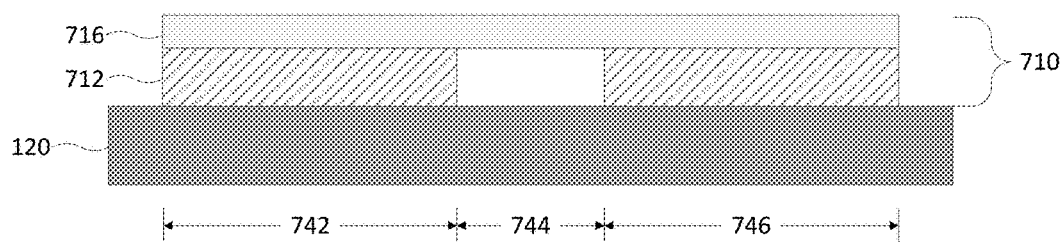
FIG. 7B is a diagram of a second cross-sectional view of the mushroom fuse, according to one embodiment.

FIG. 7A is a diagram of a first cross-sectional view 700 of a "mushroom fuse" 710 on a substrate 120, and FIG. 7B is a diagram of a second cross-sectional view 750 of the mushroom fuse 710, according to one embodiment. Like a mushroom interconnect 110, the mushroom fuse 710 has a stalk 712 with width 714 and a cap 716 with width 718. The stalk 712 is in direct contact with the substrate 120 and any contacts on the substrate 120, while the cap 716 only comes into direct contact with the stalk 712. The mushroom fuse 710 is spilt into three sections 742, 744, and 746. The first section 742 and the third section 746 of the mushroom fuse 710 have include both the stalk 712 and the cap 716, while the second section 744 only includes the cap 716 and is separated from the substrate 120 by a layer of air, creating a micro-air bridge.

The mushroom fuse 710 is a mushroom interconnect 110 with its dimensions modified to create fuse-like properties.

Specifically, the stalk 712 is widened and the cap 716 is shortened relative to the mushroom interconnect 110 in order to increase the resistance of the second section 744 of the mushroom fuse 710 relative to the other sections 742 and 746 of the mushroom fuse 710 (which include the stalk 712 in addition to the cap 716). When the current running through the mushroom fuse 710 is too high, the higher resistance of the second section 744 causes it to generate heat and melt before other sections 742 and 746 of the mushroom fuse 710 do. This causes the second portion 744 of the mushroom fuse 710 to break, disconnecting the first portion 742 from the third portion 746, and breaking any circuit that the mushroom fuse 710 is part of The exact current at which the mushroom fuse 710 fails is dependent based on the dimensions of the micro-air bridge and the material the mushroom fuse 710 is made of. The mushroom fuse 710 may be made of the same materials discussed for the mushroom interconnect 110 in some embodiments.

The mushroom fuse 710 is fabricated by the same method 200 as the mushroom interconnect 110 with the thicknesses of the one or more e-beam resist layers 212, 214, and 216 and the strength of the electron beam appropriately adjusted such that the exposed portions 232 and 222 match the desired dimensions. Additionally, the mushroom fuse 710 may be able to be produced with other lithography processes than e-beam lithography (such as photolithography) in some embodiments.

ADDITIONAL CONSIDERATIONS

The foregoing description of the embodiments of the invention has been presented for the purpose of illustration; it is not intended to be exhaustive or to limit the invention to the precise forms disclosed. Persons skilled in the relevant art can appreciate that many modifications and variations are possible in light of the above disclosure.

The language used in the specification has been principally selected for readability and instructional purposes, and it may not have been selected to delineate or circumscribe the inventive subject matter. It is therefore intended that the scope of the invention be limited not by this detailed description, but rather by any claims that issue on an application based hereon. Accordingly, the disclosure of the embodiments of the invention is intended to be illustrative, but not limiting, of the scope of the invention, which is set forth in the following claims.

What is claimed is:

1. A fuse on a substrate comprising:
a first section comprising a first stalk segment on the substrate and a first cap segment coupled to a distal end of the first stalk segment, away from the substrate, the first stalk segment narrower than the first cap segment along a lateral direction parallel to a surface of the substrate;
a second section comprising a second cap segment laterally displaced from the first cap segment along the lateral direction and connected to the first cap segment at a first end of the second cap segment; and
a third section comprising a second stalk segment on the substrate and a third cap segment coupled to a distal end of the second stalk segment, away from the substrate, one end of the third cap segment laterally displaced from the second cap segment along the lateral direction and connected to a second end of the second cap segment, the second stalk segment narrower than the third cap segment,
wherein the second cap segment is suspended between the first cap segment and the third cap segment with a layer of air between the substrate and the second cap segment during use as a fuse, and
wherein a cross section area of the second section is smaller than a cross section area of the first section or a cross section area of the third section.

2. The fuse of claim 1, wherein a length of second section is between 250 nanometers and 30 micrometers.

3. The fuse of claim 1, wherein the first stalk segment is connected to a first electrical contact and the second stalk segment is connected to a second electrical contact.

4. The fuse of claim 1, wherein a first height of the first and second stalk segments is greater than a second height of the first, second, and third cap segments.

5. A circuit comprising:
a first electrical element on a substrate;
a second electrical element on the substrate; and
a fuse between the first and second electrical elements, the fuse comprising:
a first section comprising a first stalk segment on the substrate and a first cap segment coupled to a distal end of the first stalk segment, away from the substrate, the first stalk segment narrower than the first cap segment;
a second section comprising a second cap segment laterally displaced from and connected to the first cap segment at a first end of the second cap segment; and
a third section comprising a second stalk segment on the substrate and a third cap segment coupled to a distal end of the second stalk segment, away from the substrate, one end of the third cap segment laterally displaced from the second cap segment along the lateral direction and connected to a second end of the second cap segment, the second stalk segment narrower than the third cap segment,
wherein the second cap segment is suspended between the first cap segment and the third cap segment with a layer of air between the substrate and the second cap segment during use as a fuse, and
wherein a cross section area of the second section is smaller than a cross section area of the first section or a cross section area of the third section.

6. The circuit of claim 5, wherein a first height of the first and second stalk segments is greater than a second height of the first, second, and third cap segments.

7. The fuse of claim 1, wherein the second cap is normally displaced from the substrate by a first distance and wherein the first and the third caps are normally displaced from the substrate by a second distance less than the first distance.

8. The fuse of claim 1, further comprising an obstacle element coupled to the substrate, the obstacle element passing through the layer of air between the second cap segment and the substrate without physically contacting the second cap segment.

9. The fuse of claim 1, wherein each of the first cap segment and the third cap segment has a base surface proximal to the substrate and a distal surface that is distal to the substrate, wherein the base surface is wider than the distal surface for each of the first cap segment and the third cap segment.

10. The circuit of claim 8, further comprising an obstacle element coupled to the third electrical contact, the obstacle element passing into the layer of air between the substrate and the second cap segment without physically contacting the second cap segment.

11. The circuit of claim 8, wherein each of the first cap segment and the third cap segment has a base surface proximal to the substrate and a distal surface that is distal to the substrate, wherein the base surface is wider than the distal surface for each of the first cap segment and the third cap segment.

\* \* \* \* \*